(12) United States Patent
Ando et al.

(10) Patent No.: US 11,276,732 B2
(45) Date of Patent: Mar. 15, 2022

(54) SEMICONDUCTOR MEMORY DEVICES FORMED USING SELECTIVE BARRIER METAL REMOVAL

(71) Applicant: International Business Machines Corporation, Armonk, NY (US)

(72) Inventors: Takashi Ando, Eastchester, NY (US); Hiroyuki Miyazoe, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/576,974

(22) Filed: Sep. 20, 2019

(65) Prior Publication Data
US 2021/0091141 A1    Mar. 25, 2021

(51) Int. Cl.
*H01L 21/02*   (2006.01)
*H01L 27/24*   (2006.01)
(Continued)

(52) U.S. Cl.
CPC ...... *H01L 27/2481* (2013.01); *G11C 13/0011* (2013.01); *H01L 45/1226* (2013.01);
(Continued)

(58) Field of Classification Search
CPC ............. H01L 27/2481; H01L 45/1226; H01L 45/1608; H01L 45/1253; H01L 45/1666; H01L 45/145; H01L 21/8229; H01L 21/8239; H01L 27/01; H01L 27/222; H01L 27/24; H01L 29/685; H01L 29/792; H01L 29/8615; H01L 45/04; H01L 2027/11838; H01L 2924/13089; H01L 2924/14; H01L 45/085; H01L 45/146; H01L 27/2436;
(Continued)

(56) References Cited

U.S. PATENT DOCUMENTS 7,892,936 B1 * 2/2011 Wu ..................... H01L 27/2427
                                                         438/385
8,426,839 B1   4/2013 Ma et al.
(Continued)

OTHER PUBLICATIONS

A. Redolf et al., "A novel CBRAM integration using subtractive dry-etching process of Cu enabling high-performance memory scaling down to 10nm node," Symposium on VLSI Technology Digest of Technical Papers,, 2015, pp. T134-T135.
(Continued)

*Primary Examiner* — Samuel Park
(74) *Attorney, Agent, or Firm* — Robert Sullivan; Ryan, Mason & Lewis, LLP

(57) ABSTRACT

A method for manufacturing a semiconductor memory device includes depositing a bottom metal line layer on a dielectric layer, and patterning the bottom metal line layer into a plurality of bottom metal lines spaced apart from each other. In the method, a plurality of switching element dielectric portions are formed on respective ones of the plurality of bottom metal lines, and a top metal line layer is deposited on the plurality of switching element dielectric portions. The method further includes patterning the top metal line layer into a plurality of top metal lines spaced apart from each other. The plurality of top metal lines are oriented perpendicular to the plurality of bottom metal lines.

20 Claims, 10 Drawing Sheets

(51) Int. Cl.
*G11C 13/00* (2006.01)
*H01L 45/00* (2006.01)

(52) U.S. Cl.
CPC ........ *H01L 45/1253* (2013.01); *H01L 45/145* (2013.01); *H01L 45/1608* (2013.01); *H01L 45/1666* (2013.01)

(58) Field of Classification Search
CPC ............. H01L 27/2463; H01L 45/1675; H01L 45/1233; H01L 45/12; H01L 45/16; G11C 13/0011; G11C 5/06; G11C 13/003; G11C 2213/79
See application file for complete search history.

(56) References Cited

U.S. PATENT DOCUMENTS

| | | | |
|---|---|---|---|
| 8,501,525 B2 | 8/2013 | Dahmani | |
| 8,633,117 B1 | 1/2014 | Cabral et al. | |
| 8,871,107 B2 | 10/2014 | Fuller et al. | |
| 8,962,460 B2 | 2/2015 | Imonigie et al. | |
| 9,493,879 B2 | 11/2016 | Hoinkis et al. | |
| 9,570,678 B1* | 2/2017 | Jo | H01L 45/1233 |
| 9,577,010 B2 | 2/2017 | Sciarrillo | |
| 9,799,519 B1 | 10/2017 | Joseph et al. | |
| 9,911,648 B2 | 3/2018 | Baker-O'Neal et al. | |
| 10,141,509 B2 | 11/2018 | Ando et al. | |
| 10,170,361 B2 | 1/2019 | Bruce et al. | |
| 2011/0220862 A1* | 9/2011 | Arita | H01L 45/08 257/4 |
| 2011/0312151 A1* | 12/2011 | Herner | H01L 45/1233 438/384 |
| 2012/0063201 A1* | 3/2012 | Hayakawa | H01L 45/1625 365/148 |
| 2015/0137061 A1 | 5/2015 | Donghi et al. | |
| 2015/0243708 A1* | 8/2015 | Ravasio | H01L 27/2481 257/4 |
| 2020/0411758 A1* | 12/2020 | Lin | H01L 45/122 |

OTHER PUBLICATIONS

I.G. Baek et al., "Realization of Vertical Resistive Memory (VRRAM) Using Cost Effective 3D Process," IEEE International Electron Devices Meeting, IEDM, 2011, pp. 737-740.

S.M. Rossnagel et al., "Alteration of Cu conductivity in the size effect regime," J. Vacuum Sci. Technology B., Jan./Feb. 2004, pp. 240-247, 22(1).

H. Miyazoe et al., "Fine Patterning of Copper by Plasma Etch Process for Advanced BEOL Interconnects," AVS 60th International Symposium & Exhibition, Oct. 28, 2013, 19 pages.

* cited by examiner

100

100

100

100

100

100

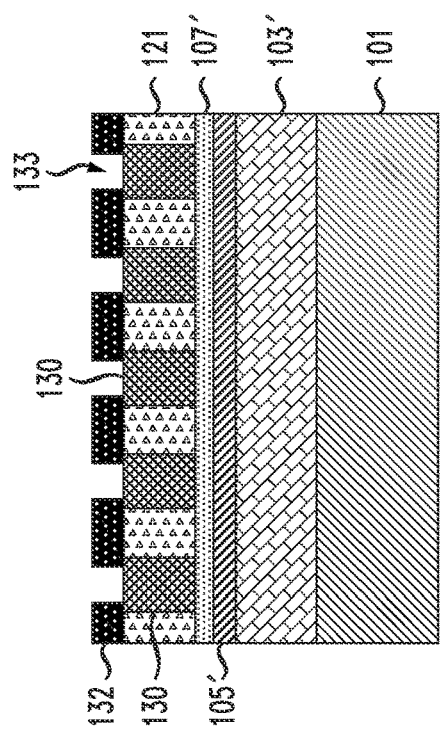
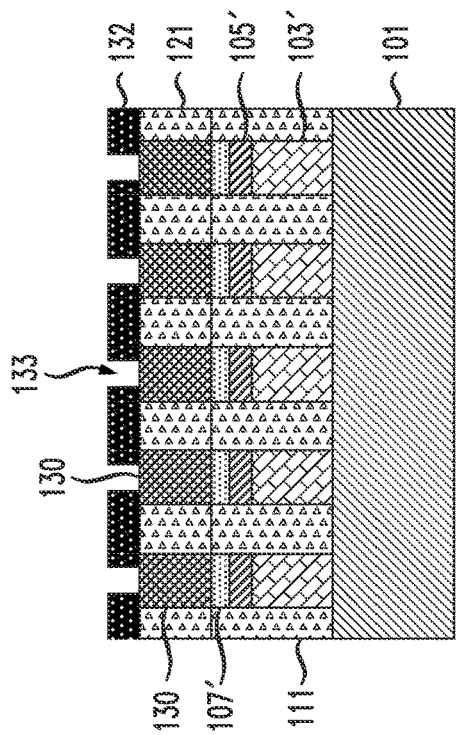

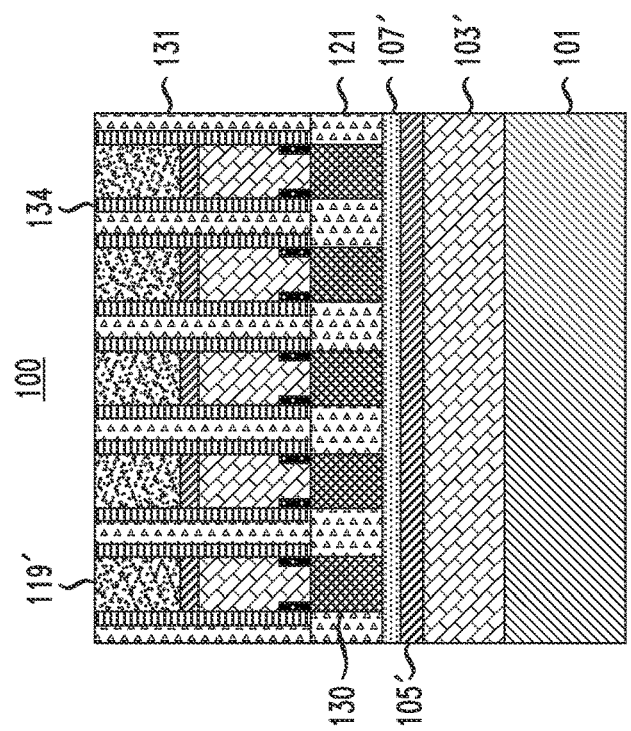
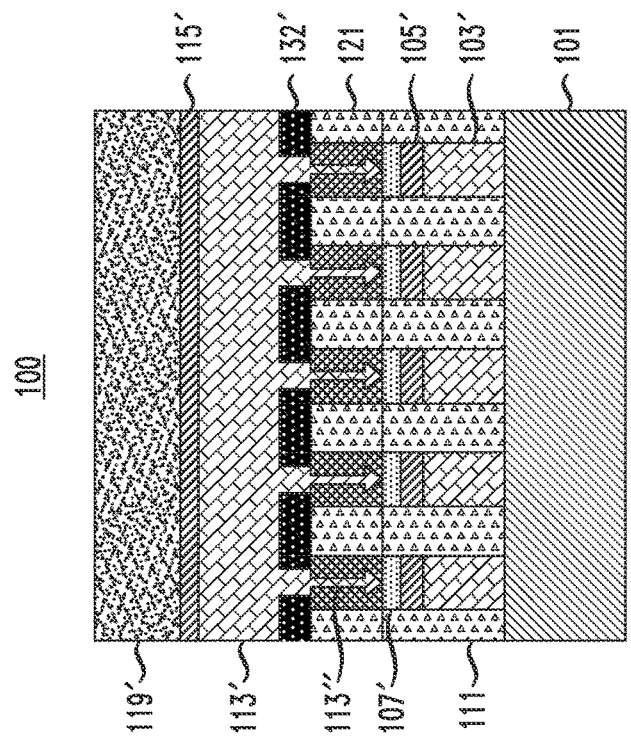
FIG. 10B
FIG. 10A

SEMICONDUCTOR MEMORY DEVICES FORMED USING SELECTIVE BARRIER METAL REMOVAL

BACKGROUND

Memory cells may include, for example, phase-change random-access memory (PCRAM), resistive random-access memory (RRAIVI or ReRAM), magnetic random-access memory (MRAM), and/or fuse/anti-fuse devices. RRAM devices have a three-layer structure of a top electrode, switching medium and bottom electrode.

Conductive bridging random access memory (CBRAM) is being considered for use in high-density and high-speed non-volatile memory applications, including, for example, in electronic synapse devices or memristors for neuromorphic computing. In neuromorphic computing applications, a resistive memory device can be used as a connection (synapse) between a pre-neuron and post-neuron, where connection weight is represented by device resistance. In order to implement a fully-connected neural network, multiple pre-neurons and post-neurons can be connected through a crossbar array of RRAM devices, which is a stacked three-dimensional (3D) configuration of the RRAIVI devices. Commercially available 3D memory devices include Crossbar™ ReRAM, from Crossbar, Inc. of Santa Clara, Calif., and 3D XPoint™, from Intel Corporation of Santa Clara, Calif. Storage in the 3D memory devices may be based on resistance changes in a stackable cross-gridded data access array.

In order to make a large scale crossbar array, it is desirable that each cross point has a relatively high resistance (or low leakage current). Otherwise, voltage drop across the metal lines becomes significant. However, CBRAM devices typically have relatively low switching resistances (on the order of kiloohms (KΩ) due to a filamentary nature, which require line resistances to be lower than that in conventional back-end-of-line (BEOL) applications.

SUMMARY

According to an exemplary embodiment of the present invention, a method for manufacturing a semiconductor memory device includes depositing a bottom metal line layer on a dielectric layer, and patterning the bottom metal line layer into a plurality of bottom metal lines spaced apart from each other. In the method, a plurality of switching element dielectric portions are formed on respective ones of the plurality of bottom metal lines, and a top metal line layer is deposited on the plurality of switching element dielectric portions. The method further includes patterning the top metal line layer into a plurality of top metal lines spaced apart from each other. The plurality of top metal lines are oriented perpendicular to the plurality of bottom metal lines.

According to an exemplary embodiment of the present invention, a semiconductor memory device includes a plurality of bottom metal lines spaced apart from each other and disposed on a dielectric layer, and a plurality of switching element dielectric portions disposed on respective ones of the plurality of bottom metal lines. A barrier metal layer is disposed on the plurality of switching element dielectric portions. The barrier metal layer includes a plurality of openings exposing at least a portion of each of the plurality of switching element dielectric portions. The semiconductor memory device also includes a plurality of top metal lines spaced apart from each other. The plurality of top metal lines are disposed on the barrier metal layer and in the plurality of openings on the plurality of switching element dielectric portions. The plurality of top metal lines are oriented perpendicular to the plurality of bottom metal lines.

According to an exemplary embodiment of the present invention, a method for manufacturing a semiconductor memory device includes depositing a bottom metal line layer on a dielectric layer, and patterning the bottom metal line layer into a plurality of bottom metal lines spaced apart from each other. In the method, a plurality of conductive bridging random access memory (CBRAM) dielectric portions are formed on respective ones of the plurality of bottom metal lines, and a barrier metal layer is formed on the plurality of CBRAM dielectric portions. A plurality of openings are formed in the barrier metal layer exposing at least a portion of each of the plurality of CBRAM dielectric portions. The method also includes depositing a top metal line layer on the barrier metal layer and in the plurality of openings. The top metal line layer is patterned into a plurality of top metal lines spaced apart from each other.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which:

FIG. 6A is a schematic cross-sectional view illustrating manufacturing of a memory device and showing deposition and patterning of a barrier metal layer, according to an embodiment of the invention.

FIG. 6B is a schematic cross-sectional view taken perpendicular to the cross-section in FIG. 6A illustrating manufacturing of a memory device and showing deposition and patterning of a barrier metal layer, according to an embodiment of the invention.

FIG. 10A is a schematic cross-sectional view illustrating manufacturing of a memory device and showing spacer deposition and etchback, and dielectric layer deposition and planarization, according to an embodiment of the invention.

FIG. 10B is a schematic cross-sectional view taken perpendicular to the cross-section in FIG. 10A illustrating manufacturing of a memory device and showing spacer deposition and etchback, and dielectric layer deposition and planarization, according to an embodiment of the invention.

DETAILED DESCRIPTION

Figure 1B:
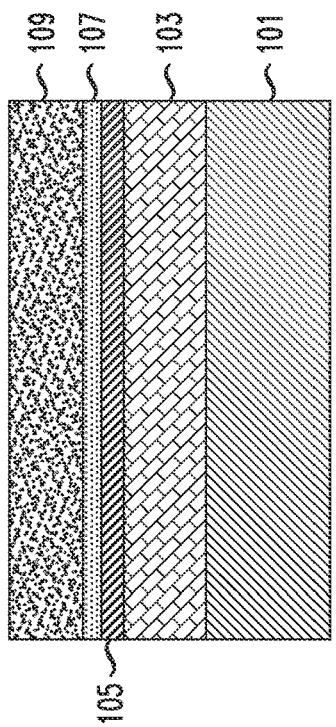
FIG. 1B is a schematic cross-sectional view taken perpendicular to the cross-section in FIG. 1A illustrating manufacturing of a memory device and showing formation of bottom metal line, metal cap, metal electrode and hardmask layers, according to an embodiment of the invention.

Exemplary embodiments of the invention will now be discussed in further detail with regard to semiconductor devices and methods of manufacturing same and, in particular, to techniques for forming and structures of memory elements comprising CBRAM memory elements with large grain top and bottom metal lines formed by subtractive patterning.

It is to be understood that the various layers and/or regions shown in the accompanying drawings are not drawn to scale, and that one or more layers and/or regions of a type commonly used in, for example, CBRAM, PCRAM, RRAM, three-dimensional (3D) RRAM, MRAM, fuse/anti-fuse, diode, ovonic threshold switch (OTS), bipolar junction transistor (BJT), complementary metal-oxide semiconductor (CMOS), field-effect transistor (FET), nanowire FET, nanosheet FET, fin field-effect transistor (FinFET), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, CBRAM, PCRAM, RRAM, 3D RRAM, MRAM, fuses/anti-fuses, diodes, OTSs, BJTs, FETs, CMOSs, MOSFETs, nanowire FETs, nanosheet FETs and/or FinFETs. By way of non-limiting example, the semiconductor devices can include, but are not limited to CBRAM, PCRAM, RRAM, 3D RRAM, MRAM, fuse/anti-fuse, diode, OTS, BJT, FET, CMOS, MOSFET, nanowire FET, nanosheet FET and FinFET devices, and/or semiconductor devices that use CBRAM, PCRAM, RRAM, 3D RRAM, MRAM, fuse/anti-fuse, diode, OTS, BJT, FET, CMOS, MOSFET, nanowire FET, nanosheet FET and/or FinFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of a substrate or other layer in the cross-sectional views, and "horizontal" refers to a direction parallel to the top surface of the substrate or other layer in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

As used herein, "low-k" refers to dielectric materials having a relative dielectric constant less than 7, and includes ultra-low-k dielectric materials.

As used herein, "high-k" refers to dielectric materials having a relative dielectric constant greater than 7.

As used herein, a "memristor" refers to is a non-volatile memory (NVM) component based on resistance switching. A memristor may control the flow of electrical current in a circuit and, in the absence of power, recall a previous resistive state through the memristor.

As used herein, "non-volatile memory (NVM)" or "non-volatile" refers to a type of computer memory that can retrieve stored information or a region which retains electrical properties (e.g., resistance) even after power is cycled off and on. The retention time of a non-volatile memory (i.e., the time period over which the stored information can be retained) may range from a few minutes to over 10 years. While traditional storage applications may require retention times of over 10 years, shorter retention times such as, for example, several minutes to a few hours may be beneficial in emerging applications such as neuromorphic computing.

RRAM devices according to one or more embodiments, are stacked in a three-dimensional (3D) cross-point configuration. As used herein, a "cross-point" structure includes a configuration of memory cells at the intersection of wordlines and bitlines. In the structure, each of the memory cells can be addressed individually, so that data can be written and read in small sizes. As used herein, a "3D cross-point" structure includes two or more stacked layers of cross-point memory structures. Storage in the RRAM devices is based on resistance changes in a stackable cross-gridded data access array.

In accordance with one or more embodiments, CBRAM memory elements are formed in a crossbar array with relatively large grain copper (Cu) or silver (Ag) metal top and bottom metal lines. The top and bottom metal lines are manufactured by subtractive etching processes, as opposed to conventional damascene processing. Conventional damascene processing of metal lines results in relatively small grains at bases of trenches filled with metal line material, which leads to more electron scattering at grain boundaries. Subtractive processing starts with a thick blanket film of metal line material having large crystal grains, which is then etched to target widths. The subtractive patterning reduces electron scattering relative to conventional damascene processing, and the resulting large crystal grains are greater than the line critical dimension (e.g., line width). The reduced electron scattering reduces resistivity (e.g., line resistance), which is desirable for large crossbar arrays.

CBRAM devices are formed at the cross-points of bottom and top metal lines by selectively removing portions of barrier metals under the top metal line layers so that metal line material can diffuse into CBRAM dielectrics during switching processes. Areas outside of CBRAM active devices remain covered with the barrier metal and/or spacers, which prevents device reliability degradation from unwanted diffusion of line material into inactive (non-CBRAM) areas.

The cross-sections in FIGS. 1B, 2B, 3B, 4B, 5B, 6B, 7B, 8B, 9B and 10B are taken perpendicular to the cross-sections in FIGS. 1A, 2A, 3A, 4A, 5A, 6A, 7A, 8A, 9A and 10A, such that the view of FIGS. 1A, 2A, 3A, 4A, 5A, 6A, 7A, 8A, 9A and 10A is rotated 90 degrees around the vertical axis to result in the views in FIGS. 1B, 2B, 3B, 4B, 5B, 6B, 7B, 8B, 9B and 10B. The lengths of elements going into and out of the page in FIGS. 1A, 2A, 3A, 4A, 5A, 6A, 7A, 8A, 9A and 10A are shown as lengths in the left and right directions in FIGS. 1B, 2B, 3B, 4B, 5B, 6B, 7B, 8B, 9B and 10B. The widths of elements going into and out of the page in FIGS. 1B, 2B, 3B, 4B, 5B, 6B, 7B, 8B, 9B and 10B are shown as widths in the left and right directions in FIGS. 1A, 2A, 3A, 4A, 5A, 6A, 7A, 8A, 9A and 10A.

Figure 1A:
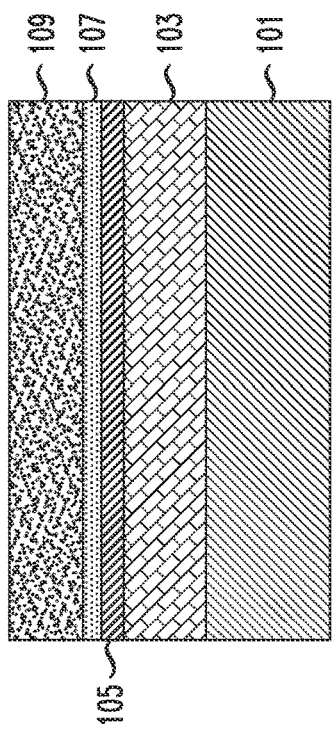
FIG. 1A is a schematic cross-sectional view illustrating manufacturing of a memory device and showing formation of bottom metal line, metal cap, metal electrode and hardmask layers, according to an embodiment of the invention.

Referring to FIGS. 1A and 1B, a bottom metal line layer 103, a metal cap layer 105, a metal electrode layer 107, and a hardmask layer 109 are formed on a dielectric layer 101. According to an embodiment, the dielectric layer 101 is an inter-layer dielectric (ILD) layer. The material of the ILD layer 101 can include, but is not necessarily limited to, a low-K dielectric material, such as, for example, silicon oxide ($SiO_2$), silicon nitride (SiN), silicon oxynitride (SiON), boron nitride (BN), and/or silicon boron nitride (SiBN). The ILD layer 101 is deposited using deposition techniques such as, for example, chemical vapor deposition (CVD), plasma enhanced CVD (PECVD), radio-frequency CVD (RFCVD), hot wire CVD (HWCVD), physical vapor deposition (PVD), atomic layer deposition (ALD), molecular beam deposition (MBD), pulsed laser deposition (PLD), liquid source misted chemical deposition (LSMCD), and/or sputtering, which may be followed by a planarization process, such as, chemical mechanical polishing (CMP), to remove excess portions of the ILD layer 101 after deposition.

As can be understood by one of ordinary skill in the art, the ILD layer 101 can be on a semiconductor substrate (not shown), with intervening layers between the ILD layer 101 and the substrate. A semiconductor substrate may comprise semiconductor material including, but not limited to, Si, SiGe, SiC, SiGeC or other like semiconductor. In addition, multiple layers of the semiconductor materials can be used as the semiconductor material of the substrate. A plurality of devices can be on the substrate, such as, for example, transistors, capacitors, and resistors. For example, the ILD layer 101 may be formed on a front end of a CMOS chip (e.g., front-end-of-line (FEOL)) or at a back-end-of-line (BEOL), where fabrication is performed at temperatures, for example, below or at ~400° C. to prevent damage to BEOL metal lines.

As noted above in connection with subtractive processing, the bottom metal line layer 103 comprises a blanket film of metal line material having relatively large crystal grains. The grains may extend from a bottom surface to a top surface of the bottom metal line layer 103. According to illustrative embodiments, the bottom metal line layer 103 comprises Cu or Ag, and is deposited using, for example, CVD, PECVD, RFCVD, HWCVD, PVD, ALD, MLD, MBD, PLD, LSMCD, sputtering and/or plating. A thickness (e.g., vertical height) of the bottom metal line layer 103 is about 50 nm to about 200 nm, but thicker or thinner layers may be used as well.

A metal cap layer 105 comprising, but not necessarily limited to, ruthenium (Ru), iridium (Ir), platinum (Pt), palladium (Pd), tungsten (W), gold (Au), tantalum nitride (TaN), tantalum (Ta), and/or mixtures thereof, is deposited on the bottom metal line layer 103 using, for example, CVD, PECVD, RFCVD, HWCVD, PVD, ALD, MLD, MBD, PLD, LSMCD, sputtering and/or plating. The metal cap layer 105 prevents diffusion of Cu or Ag from the bottom metal line layer 103 into the layers above the metal cap layer 105. A thickness (e.g., vertical height) of the metal cap layer 105 is about 5 nm to about 10 nm, but thicker or thinner layers may be used as well.

A metal electrode layer 107 comprising an electrically conductive material, such as, but not necessarily limited to, titanium nitride (TiN), tungsten, cobalt, tantalum, titanium, aluminum, ruthenium, and/or iridium is deposited on the metal cap layer 105 using, for example, CVD, PECVD, RFCVD, HWCVD, PVD, ALD, MLD, MBD, PLD, LSMCD, sputtering and/or plating. A thickness (e.g., vertical height) of the metal electrode layer 107 is about 5 nm to about 35 nm.

A hardmask layer 109 is deposited on the metal electrode layer 107. In accordance with an embodiment, a thickness (e.g., height with respect to the underlying layer) of the hardmask layer 109 can be approximately 20 nm, but thicker or thinner layers may be used as well. The hardmask layer 109 can be deposited using, for example CVD, PECVD, RFCVD, HWCVD, PVD, ALD, MLD, MBD, PLD, LSMCD, and/or sputtering. According to one or more embodiments, the hardmask layer 109 comprises a dielectric material, such as, but not necessarily limited to, SiN.

Figure 2A:
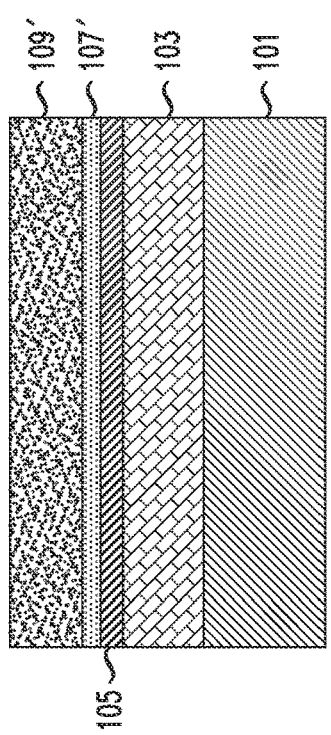
FIG. 2A is a schematic cross-sectional view illustrating manufacturing of a memory device and showing patterning of a metal electrode layer, according to an embodiment of the invention.
Figure 2B:
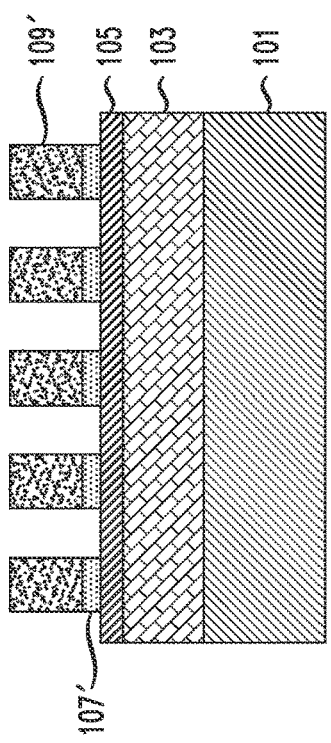
FIG. 2B is a schematic cross-sectional view taken perpendicular to the cross-section in FIG. 2A illustrating manufacturing of a memory device and showing patterning of a metal electrode layer, according to an embodiment of the invention.

Referring to FIGS. 2A and 2B, the hardmask layer 109 is patterned into respective hardmask portions 109' spaced apart from each other. Using the hardmask portions 109' as masks, exposed portions of the metal electrode layer 107 not covered by the hardmask portions 109' are removed to form metal electrodes 107'. The metal electrodes 107' are patterned to be spaced apart from each other, using, for example, photolithography and reactive ion etching (ME). The etching of the exposed portions of the metal electrode layer 107 is performed using, for example, fluorocarbons, hydrofluorocarbons, $SF_6$, chlorine, HBr, $BCl_3$ and/or mixtures thereof.

Figure 3B:
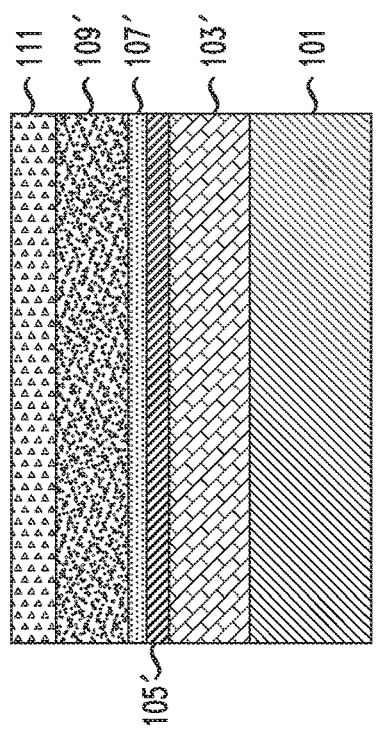
FIG. 3B is a schematic cross-sectional view taken perpendicular to the cross-section in FIG. 3A illustrating manufacturing of a memory device and showing patterning of a metal cap layer and a bottom metal line layer, and dielectric layer deposition, according to an embodiment of the invention.
Figure 3A:
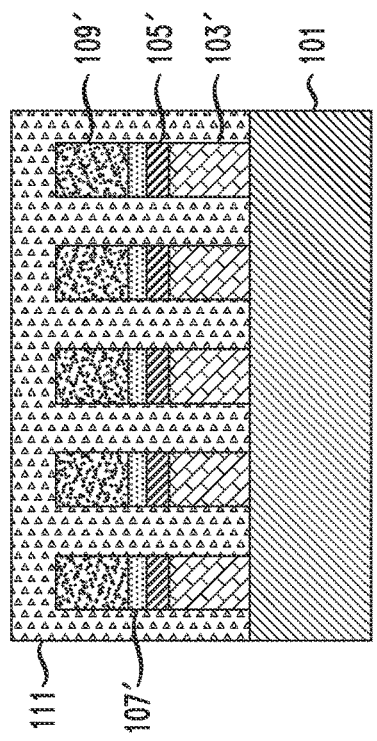
FIG. 3A is a schematic cross-sectional view illustrating manufacturing of a memory device and showing patterning of a metal cap layer and a bottom metal line layer, and dielectric layer deposition, according to an embodiment of the invention.

Referring to FIGS. 3A and 3B, using the hardmask portions 109' as masks, additional etching processes are performed to similarly remove exposed portions of the metal cap layer 105 to result in metal cap layers 105' spaced apart from each other, and then to remove exposed portions of the metal line layer 103 to result in metal lines 103' spaced apart from each other. The etching processes result in stacked structures including the metal lines 103', the metal cap layers 105' and the metal electrodes 107' sequentially stacked on each other under the hardmask portions 109'. The etching of the exposed portions of the metal cap layer 105 is performed using, for example, oxygen, argon, helium, hydrogen, hydrocarbons, $CH_3OH$, $C_2H_5OH$, and/or mixtures thereof, and the etching of the subsequently exposed portions of the metal line layer 103 is performed using, for example, oxygen, argon, helium, hydrogen, hydrocarbons, $CH_3OH$, $C_2H_5OH$, and/or mixtures thereof. According to an embodiment, the resulting crystal grains of the metal lines 103' are greater than the critical dimension (e.g., line width) of the metal lines 103'.

Following the etching to form the stacked structures, a dielectric layer 111 is deposited on the ILD layer 101 and on and around the stacked structures including the hardmask portions 109' thereon. The dielectric layer 111 can be deposited using, for example CVD, PECVD, RFCVD, HWCVD, PVD, ALD, MLD, MBD, PLD, LSMCD, and/or sputtering. According to one or more embodiments, the dielectric layer 111 comprises a dielectric material, such as, but not necessarily limited to, SiN, $SiO_2$, SiON, BN, SiBN, and/or other conventional low-k materials used in BEOL structures.

Figure 4B:
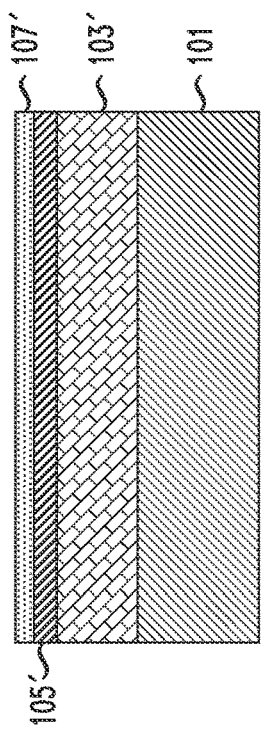
FIG. 4B is a schematic cross-sectional view taken perpendicular to the cross-section in FIG. 4A illustrating manufacturing of a memory device and showing planarization to expose metal electrode layers, according to an embodiment of the invention.
Figure 4A:
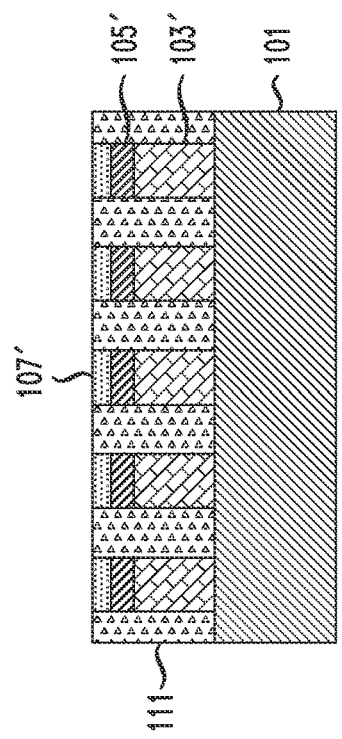
FIG. 4A is a schematic cross-sectional view illustrating manufacturing of a memory device and showing planarization to expose metal electrode layers, according to an embodiment of the invention.

Referring to FIGS. 4A and 4B, a planarization process, such as, for example, CMP, is performed to remove the hardmask portions 109' and a portion of the dielectric layer 111 down to the metal electrodes 107', so that top surfaces of the metal electrodes 107' are exposed.

Figure 5B:
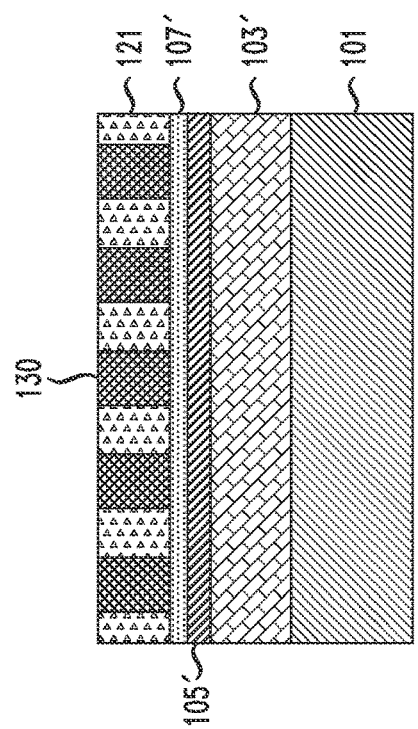
FIG. 5B is a schematic cross-sectional view taken perpendicular to the cross-section in FIG. 5A illustrating manufacturing of a memory device and showing deposition and patterning of a switching element dielectric, and isolation layer deposition, according to an embodiment of the invention.
Figure 5A:
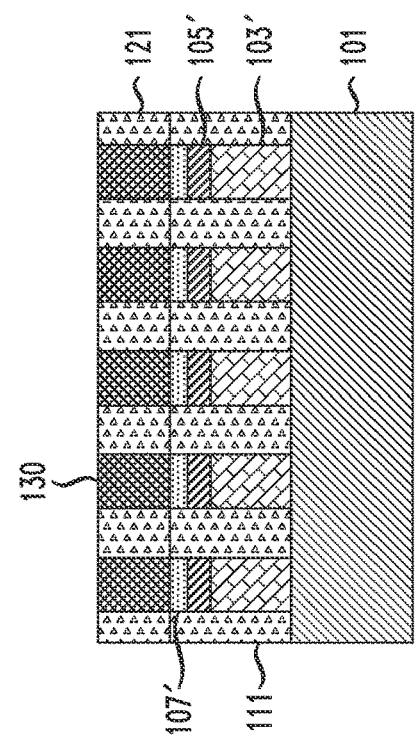
FIG. 5A is a schematic cross-sectional view illustrating manufacturing of a memory device and showing deposition and patterning of a switching element dielectric, and isolation layer deposition, according to an embodiment of the invention.

Referring to FIGS. 5A and 5B, a switching element dielectric (e.g., CBRAM dielectric) layer is deposited and patterned by, for example, photolithography and RIE into switching element dielectric portions 130. The switching element dielectric portions 130 contact the metal electrodes 107'. In FIG. 5A, switching element dielectric portions 130 are patterned to have lateral sides in-line or substantially in-line with lateral sides of the stacked structures including the metal lines 103', the metal cap layers 105' and the metal electrodes 107' sequentially stacked on each other.

As can be seen in FIGS. 5A and 5B, the switching element dielectric portions 130 are patterned to be spaced apart in a first direction corresponding to FIG. 5A and in a second direction perpendicular to the first direction corresponding to FIG. 5B, whereas the stacked structures including the metal lines 103', the metal cap layers 105' and the metal electrodes 107' sequentially stacked on each other are patterned to be spaced apart in the first direction, but not in the second direction. The stacked structures are continuous in the second direction.

The RIE of exposed portions of the switching element dielectric layer to form the switching element dielectric portions 130 is performed using, for example, fluorocarbons, hydrofluorocarbons, $SF_6$, chlorine, HBr, $BCl_3$, oxygen, hydrogen and/or mixtures thereof. The switching element dielectric (e.g., CBRAM dielectric) portions 130 comprise, for example, amorphous silicon (a-Si), amorphous silicon germanium (a-SiGe), $SiO_2$, hafnium oxide ($HfO_2$), aluminum oxide ($Al_2O_3$).

Following formation of the switching element dielectric portions 130, a dielectric layer 121 is deposited on the dielectric layer 111 and on and around the switching element dielectric portions 130. The dielectric layer 121 can be deposited using, for example CVD, PECVD, RFCVD, HWCVD, PVD, ALD, MLD, MBD, PLD, LSMCD, and/or sputtering. According to one or more embodiments, the dielectric layer 121 comprises a dielectric material, such as, but not necessarily limited to, SiN, $SiO_2$, SiON, BN, and/or SiBN. A planarization process, such as, for example, CMP, is performed to remove excess portions of the dielectric layer 121 on the switching element dielectric portions 130, so that top surfaces of the switching element dielectric portions 130 are exposed. The dielectric layer 121 fills-in spaces between the switching element dielectric portions 130 to function as an electrical isolation film between CBRAM devices.

Referring to FIGS. 6A and 6B, a barrier metal layer 132 is deposited and patterned to include openings 133 over the switching element dielectric portions 130. The barrier metal layer 132 comprises, but is not necessarily limited to, TaN, Ta, and/or mixtures thereof and is deposited on the bottom dielectric layer 121 and the switching element dielectric portions 130 using, for example, CVD, PECVD, RFCVD, HWCVD, PVD, ALD, MLD, MBD, PLD, LSMCD, sputtering and/or plating. The barrier metal layer 132 prevents diffusion of Cu or Ag from the subsequently formed top metal line layer 113 into the layers below the barrier metal layer 132. The deposited barrier metal layer 132 is patterned using, for example, lithography and RIE to include the openings 133 over parts of the switching element dielectric portions 130, which, as discussed further herein below, permit metal from the deposition of the top metal line layer 113 to be deposited in the openings 133 directly on the switching element dielectric portions 130. The metal in the openings 133 diffuses into the switching element dielectric portions 130 during operation (see, e.g., FIG. 10A). The openings 133 correspond to the cross-points of bottom and top metal lines 103' and 113' so that metal line material can diffuse into CBRAM dielectrics during switching processes. Areas outside of CBRAM active devices remain covered with the barrier metal layer 132 and/or spacers 134 (see FIG. 10B), which prevents device reliability degradation from unwanted diffusion of line material into inactive (non-CBRAM) areas. A thickness (e.g., vertical height) of the barrier metal layer 132 is about 5 nm to about 10 nm, but thicker or thinner layers may be used as well.

Figure 7B:
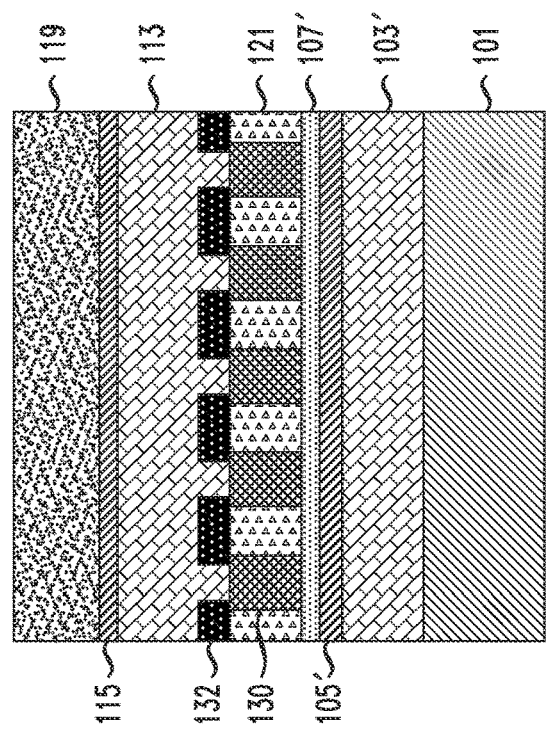
FIG. 7B is a schematic cross-sectional view taken perpendicular to the cross-section in FIG. 7A illustrating manufacturing of a memory device and showing deposition of top metal line, metal cap and hardmask layers, according to an embodiment of the invention.
Figure 7A:
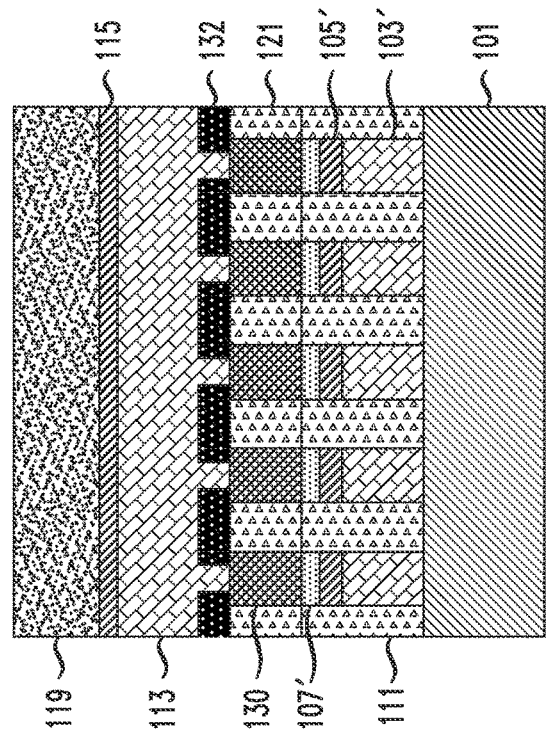
FIG. 7A is a schematic cross-sectional view illustrating manufacturing of a memory device and showing deposition of top metal line, metal cap and hardmask layers, according to an embodiment of the invention.

Referring to FIGS. 7A and 7B, as noted above in connection with subtractive processing, the top metal line layer 113 comprises a blanket film of metal line material having relatively large crystal grains. The grains may extend from a bottom surface to a top surface of the bottom metal line layer 113. According to illustrative embodiments, the top metal line layer 113 comprises Cu or Ag, and is deposited using, for example, CVD, PECVD, RFCVD, HWCVD, PVD, ALD, MLD, MBD, PLD, LSMCD, sputtering and/or plating. A thickness (e.g., vertical height) of the top metal line layer 113 is about 50 nm to about 200 nm, but thicker or thinner layers may be used as well. A planarization process, such as, for example, CMP, is performed on the top metal line 113 following deposition, and prior to formation of the metal cap layer 115.

As can be seen in FIGS. 7A and 7B, portions of the top metal line layer 113 are formed in the openings 133 in the barrier metal layer 132. These portions of the metal line layer 113 in the openings 133 contact the switching element dielectric portions 130, and function as top electrodes (e.g., anodes) of respective CBRAM devices including the switching element dielectric portions 130 and the electrodes 107 functioning as bottom electrodes (e.g., cathodes) of the respective CBRAM devices.

A metal cap layer 115 comprising, but not necessarily limited to, Ru, Ir, Pt, Pd, W, Au, TaN, Ta and/or mixtures thereof is deposited on the top metal line layer 113 using, for example, CVD, PECVD, RFCVD, HWCVD, PVD, ALD, MLD, MBD, PLD, LSMCD, sputtering and/or plating. The metal cap layer 113 prevents diffusion of Cu or Ag from the top metal line layer 113 into the layers above the metal cap layer 115. A thickness (e.g., vertical height) of the metal cap layer 115 is about 5 nm to about 30 nm, but thicker or thinner layers may be used as well.

A hardmask layer 119 is deposited on the metal cap layer 115. In accordance with an embodiment, a thickness (e.g., height with respect to the underlying layer) of the hardmask layer 119 can be approximately 20 nm, but thicker or thinner layers may be used as well. The hardmask layer 119 can be deposited using, for example CVD, PECVD, RFCVD, HWCVD, PVD, ALD, MLD, MBD, PLD, LSMCD, and/or sputtering. According to one or more embodiments, the hardmask layer 119 comprises a dielectric material, such as, but not necessarily limited to, SiN.

Figure 8A:
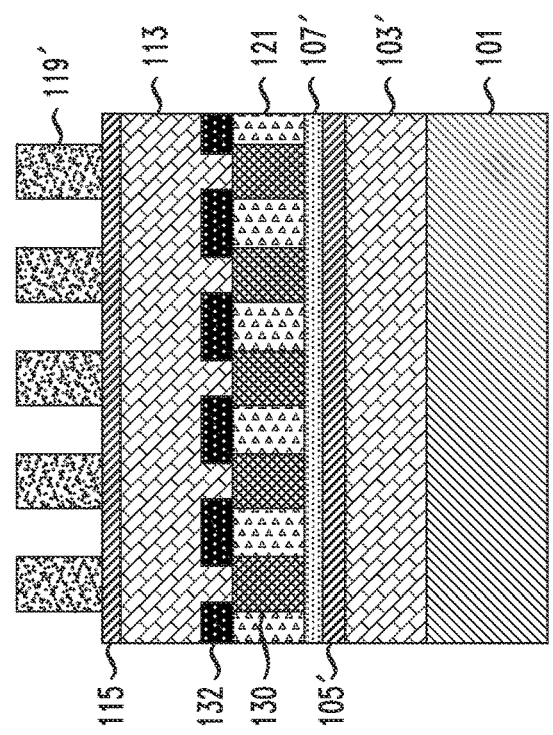
FIG. 8A is a schematic cross-sectional view illustrating manufacturing of a memory device and showing patterning of a hardmask layer, according to an embodiment of the invention.
Figure 8B:
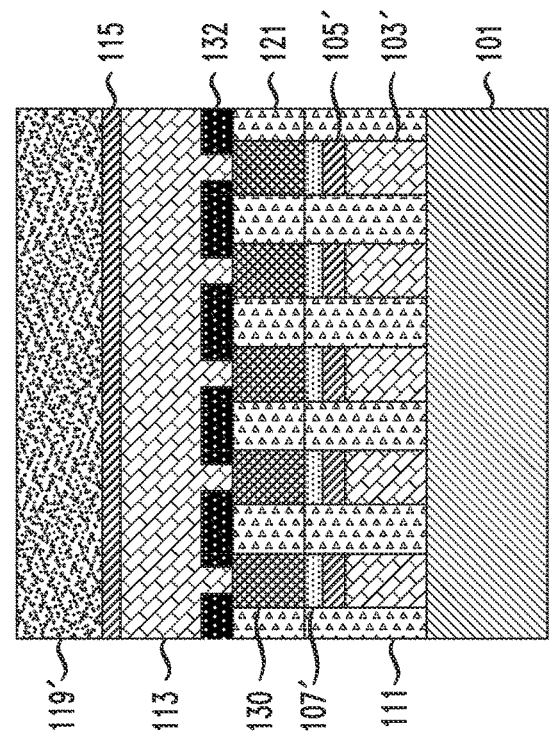
FIG. 8B is a schematic cross-sectional view taken perpendicular to the cross-section in FIG. 8A illustrating manufacturing of a memory device and showing patterning of a hardmask layer, according to an embodiment of the invention.

Referring to FIGS. 8A and 8B, the hardmask layer 119 is patterned into respective hardmask portions 119' spaced apart from each other. As can be see, the hardmask portions 119' are spaced apart from each other along the direction of the cross-section in FIG. 8B, but not along the direction of the cross-section in FIG. 8A. The patterning in FIG. 8B is perpendicular to the patterning of the hardmask layer 109 described in connection with FIG. 2A, where the hardmask portions 109' are spaced apart from each other along the direction of the cross-section in FIG. 2A, but not along the direction of the cross-section in FIG. 2B.

Figure 9B:
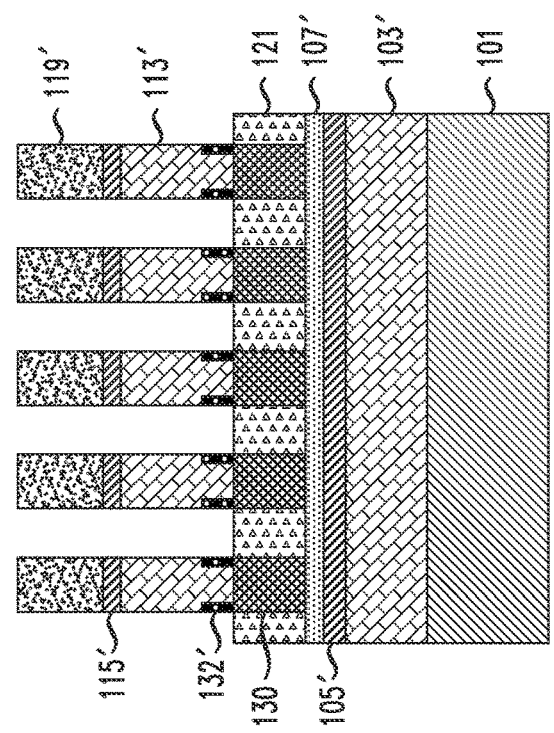
FIG. 9B is a schematic cross-sectional view taken perpendicular to the cross-section in FIG. 9A illustrating manufacturing of a memory device and showing patterning of metal cap, top metal line and barrier metal layers, according to an embodiment of the invention.
Figure 9A:
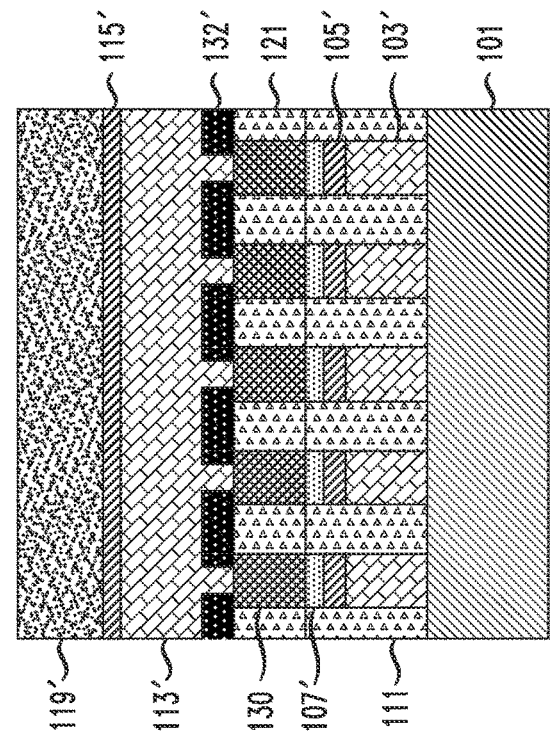
FIG. 9A is a schematic cross-sectional view illustrating manufacturing of a memory device and showing patterning of metal cap, top metal line and barrier metal layers, according to an embodiment of the invention.

Referring to FIGS. 9A and 9B, using the hardmask portions 119' as masks, etching processes are performed to remove exposed portions of the metal cap layer 115 to result in metal cap layers 115' spaced apart from each other, then to remove exposed portions of the metal line layer 113 to result in metal lines 113' spaced apart from each other, and then to remove exposed portions of the barrier metal layer 132 to result in barrier metal layer portions 132'. The etching processes result in stacked structures including the metal lines 113' and the metal cap layers 115' sequentially stacked on each other under the hardmask portions 119'. Remaining metal barrier layer portions 132' are formed at bottom portions of the stacked structures adjacent bottom portions of the metal lines 113' on the switching element dielectric portions 130. The etching of the exposed portions of the metal cap layer 115 is performed using, for example, oxygen, argon, helium, hydrogen, hydrocarbons, $CH_3OH$, $C_2H_5OH$, and/or mixtures thereof, the etching of the subsequently exposed portions of the metal line layer 113 is performed using, for example, oxygen, argon, helium, hydrogen, hydrocarbons, $CH_3OH$, $C_2H_5OH$, and/or mixtures thereof, and the etching of the subsequently exposed portions of the barrier metal layer 132 is performed using, for example, fluorocarbons, hydrofluorocarbons, $SF_6$, chlorine, HBr, $BCl_3$, oxygen, hydrogen and/or mixtures thereof. According to an embodiment, the resulting crystal grains of the metal lines 113' are greater than the critical dimension (e.g., line width) of the metal lines 113'.

As can be understood from FIGS. 9A and 9B, the top metal lines 113' are oriented perpendicularly to the bottom metal lines 103', so that the top metal lines 113' extend in a direction perpendicular to the extension direction of the bottom metal lines 103' in accordance with a cross-point configuration.

Referring to FIGS. 10A and 10B, a spacer material, such as, for example, SiN, SiBN, silicon carbon nitride (SiCN), SiON, siliconborocarbonitride (SiBCN), silicon oxycarbonitride (SiOCN) and/or other suitable dielectric material is conformally deposited on exposed surfaces, including on sidewalls and top surfaces of the stacked structures including the metal lines 113' and the metal cap layers 115' sequentially stacked on each other under the hardmask portions 119', and on top surfaces of the dielectric layer 121. The spacer material can be deposited using conformal deposition techniques, including, but not limited to, ALD or other conformal deposition process.

A directional etch using, example, RIE, is performed to remove portions of the spacer material from horizontal surfaces of the dielectric layer 121, and from top surfaces of the hardmask portions 119' to result in the spacers 134 remaining on the vertical sidewalls of the stacked structures. A width of the spacers 134 (horizontal direction in FIG.

10B) may include but is not limited to about 5 nm to about 20 nm. Like the barrier metal layer portions 132', the spacers 134 electrically isolate the metal lines 113' and prevent diffusion of metal line material into in-active regions.

A dielectric layer 131 is deposited on the dielectric layer 121 and on and around the stacked structures including the spacers 134 thereon. The dielectric layer 131 can be deposited using, for example CVD, PECVD, RFCVD, HWCVD, PVD, ALD, MLD, MBD, PLD, LSMCD, and/or sputtering. According to one or more embodiments, the dielectric layer 131 comprises a dielectric material, such as, but not necessarily limited to, SiN, $SiO_2$, SiON, BN, SiBN, and/or other conventional low-k materials used in BEOL structures. A planarization process, such as, for example, CMP, is performed to remove excess portions of the dielectric layer 131 on the hardmask portions 119'. The dielectric layer 131 fills-in spaces between the stacked structures including the metal lines 113' and the metal cap layers 115' sequentially stacked on each other under the hardmask portions 119'. The dielectric layer electrically isolates the metal lines 113' from each other.

As shown in FIG. 10A, during switching processes, the diffused metal 113" diffuses into the switching element dielectric portions 130 via openings 133. The openings 133 correspond to the cross-points of bottom and top metal lines 103' and 113' so that metal line material can diffuse into CBRAM dielectrics during switching processes.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor memory device, comprising:
   depositing a bottom metal line layer on a first dielectric layer;
   patterning the bottom metal line layer into a plurality of bottom metal lines spaced apart from each other;
   forming a plurality of switching element dielectric portions on respective ones of the plurality of bottom metal lines, wherein the switching element dielectric portions are in a stacked configuration with the respective ones of the plurality of bottom metal lines, and lateral sides of the switching element dielectric portions are in-line with lateral sides of the stacked configuration;
   depositing a second dielectric layer on the first dielectric layer between the plurality of bottom metal lines;
   forming a barrier metal layer on the second dielectric layer and outer portions of the plurality of switching element dielectric portions thereby exposing a central portion of the plurality of switching element dielectric portions;
   depositing a top metal line layer on the exposed central portions of the plurality of switching element dielectric portions and over the barrier metal layer; and
   patterning the top metal line layer into a plurality of top metal lines spaced apart from each other;
   wherein the plurality of top metal lines are oriented perpendicular to the plurality of bottom metal lines.

2. The method according to claim 1, wherein the plurality of top metal lines, the plurality of bottom metal lines, and the plurality of switching element dielectric portions are parts of a memory cell array having a cross-point structure.

3. The method according to claim 1, wherein the switching element dielectric portions are components of respective conductive bridging random access memory devices.

4. The method according to claim 3, wherein the switching element dielectric portions comprise at least one of amorphous silicon, amorphous silicon germanium, silicon oxide, hafnium oxide, and aluminum oxide.

5. The method according to claim 1, wherein the top metal line layer and the bottom metal line layer each comprise one of copper and silver.

6. The method according to claim 1, wherein patterning the bottom metal line layer comprises masking portions of the bottom metal line layer and etching exposed portions of the bottom metal line layer to form the plurality of bottom metal lines.

7. The method according to claim 1, wherein patterning the top metal line layer comprises masking portions of the top metal line layer and etching exposed portions of the top metal line layer to form the plurality of top metal lines.

8. The method according to claim 1, further comprising forming a plurality of spacers on the plurality of top metal lines.

9. The method according to claim 1, further comprising:
   forming a metal cap layer on the bottom metal line layer;
   forming an electrode layer on the metal cap layer; and
   patterning the metal cap layer and the electrode layer into a plurality of metal cap layers and a plurality of electrodes corresponding to the plurality of bottom metal lines.

10. The method according to claim 9, wherein the plurality of electrodes are positioned between the plurality of switching element dielectric portions and the plurality of metal cap layers.

11. The method according to claim 1, further comprising depositing an additional dielectric layer between the plurality of top metal lines.

12. A method for manufacturing a semiconductor memory device, comprising:
   depositing a bottom metal line layer on a first dielectric layer;
   patterning the bottom metal line layer into a plurality of bottom metal lines spaced apart from each other;
   forming a plurality of switching element dielectric portions on respective ones of the plurality of bottom metal lines, wherein the switching element dielectric portions are in a stacked configuration with the respective ones of the plurality of bottom metal lines, and lateral sides of the switching element dielectric portions are in-line with lateral sides of the stacked configuration;
   depositing a second dielectric layer on the first dielectric layer between the plurality of bottom metal lines;
   forming a barrier metal layer on the second dielectric layer and the plurality of switching element dielectric portions;
   forming a plurality of openings in the barrier metal layer exposing at least a portion of each of the plurality of switching element dielectric portions;
   depositing a top metal line layer on the barrier metal layer and in the plurality of openings; and
   patterning the top metal line layer into a plurality of top metal lines spaced apart from each other.

13. The method according to claim 12, wherein:
   patterning the bottom metal line layer comprises masking portions of the bottom metal line layer and etching exposed portions of the bottom metal line layer to form the plurality of bottom metal lines; and patterning the top metal line layer comprises masking portions of the top metal line layer and etching exposed portions of the top metal line layer to form the plurality of top metal lines.

14. The method according to claim 12, wherein the plurality of top metal lines, the plurality of bottom metal lines, and the plurality of switching element dielectric portions are parts of a memory cell array having a cross-point structure.

15. The method according to claim 12, wherein the switching element dielectric portions are components of respective conductive bridging random access memory devices.

16. The method according to claim 15, wherein the switching element dielectric portions comprise at least one of amorphous silicon, amorphous silicon germanium, silicon oxide, hafnium oxide, and aluminum oxide.

17. The method according to claim 12, wherein the top metal line layer and the bottom metal line layer each comprise one of copper and silver.

18. The method according to claim 12, further comprising forming a plurality of spacers on the plurality of top metal lines.

19. The method according to claim 12, further comprising:
   forming a metal cap layer on the bottom metal line layer;
   forming an electrode layer on the metal cap layer; and
   patterning the metal cap layer and the electrode layer into a plurality of metal cap layers and a plurality of electrodes corresponding to the plurality of bottom metal lines.

20. The method according to claim 19, wherein the plurality of electrodes are positioned between the plurality of switching element dielectric portions and the plurality of metal cap layers.

* * * * *